(12) United States Patent
Casale

(10) Patent No.: US 6,535,008 B1
(45) Date of Patent: Mar. 18, 2003

(54) DUAL STAGE IN-CIRCUIT TEST FIXTURE FOR CIRCUIT BOARD TESTING

(75) Inventor: Charles Casale, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 7 days.

(21) Appl. No.: 09/924,789

(22) Filed: Aug. 8, 2001

(51) Int. Cl.$^7$ .............................................. G01R 31/02
(52) U.S. Cl. ....................................................... 324/758
(58) Field of Search ................................. 324/754, 755, 324/758; 439/61–73, 482

(56) References Cited

U.S. PATENT DOCUMENTS

| | | | | |
|---|---|---|---|---|
| 4,814,698 A | * | 3/1989 | St Onge et al. | 324/158 F |
| 5,311,120 A | * | 5/1994 | Bartholomew | 324/158 F |
| 5,396,186 A | * | 3/1995 | Scheutzow | 324/754 |
| 6,084,422 A | * | 7/2000 | Bartholomew | 324/761 |

OTHER PUBLICATIONS

1998 Hewlett–Packard Annual Report.
APG Test Consultants, Inc.
Circuit Check.
9090 Single–Density Tester.

\* cited by examiner

Primary Examiner—N. Le
Assistant Examiner—Etienne P LeRoux
(74) Attorney, Agent, or Firm—Campbell Stephenson Ascolese LLP; Samuel G. Campbell, III

(57) ABSTRACT

A fixture is provided for use in connection with a circuit board tester. The fixture can move the unit under test (UUT), against the urging or a set of springs, to a first position in which the UUT contacts all probes of the tester, for performing a first set of tests. A partial vacuum is created in the region near the probes to permit atmospheric pressure to move the UUT to the first position. A movable or actuateable limiting member is moved to a position which can engage a fixture member in a manner such that, upon movement of the UUT in a direction away from the probes, when the vacuum is released, the amount of movement is limited, to position the UUT to contact only the taller probes. The actuator may engage any of various parts of the fixture, or a pocket found therein, including support plates or lids, or may contact a surface of the UUT.

40 Claims, 15 Drawing Sheets

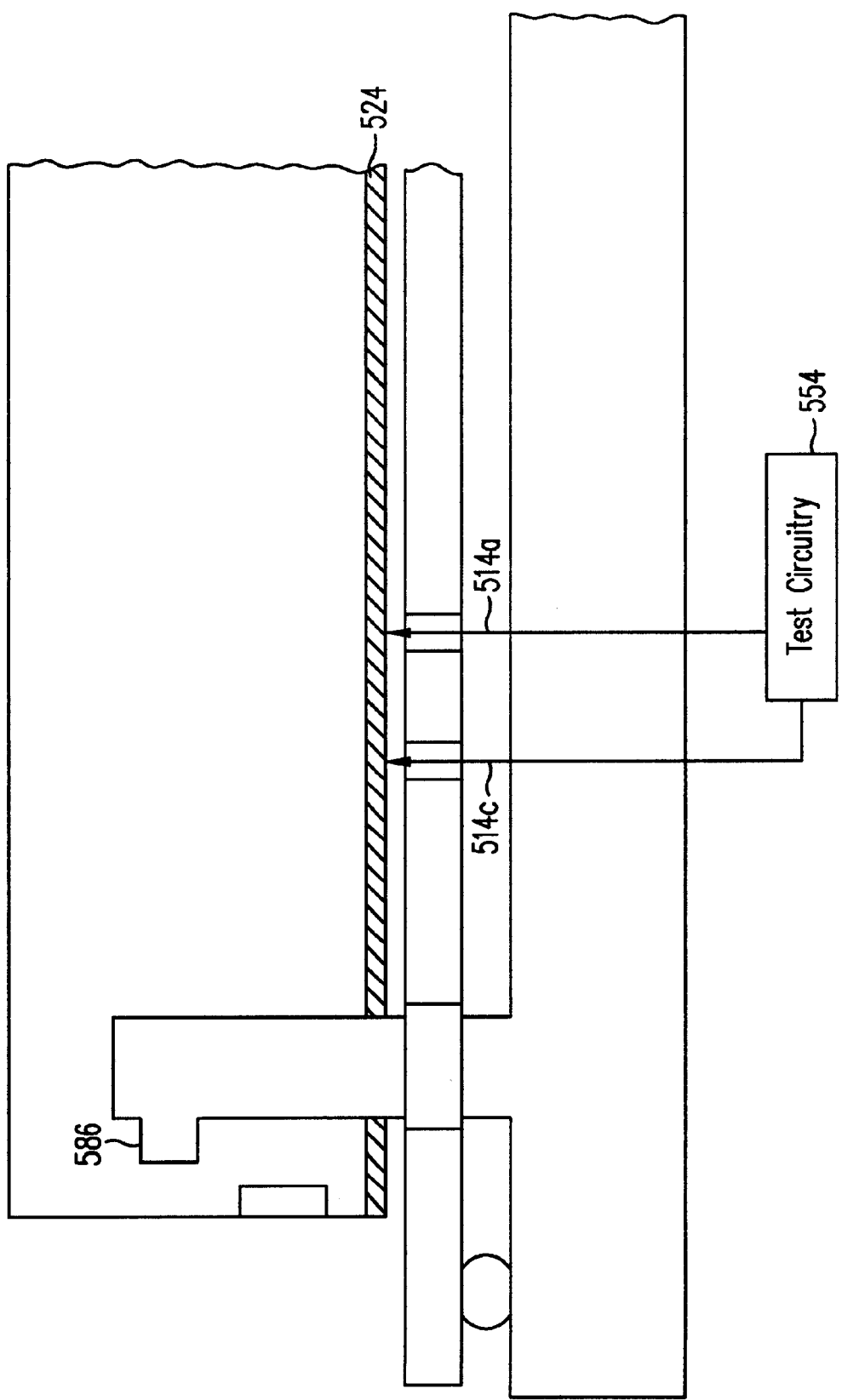

DUAL STAGE IN-CIRCUIT TEST FIXTURE FOR CIRCUIT BOARD TESTING

The present invention relates to a fixture which positions a circuit board with respect to a plurality of probes of a circuit board tester and in particular to a fixture for dual stage testing using probes of two or more different heights or lengths.

BACKGROUND INFORMATION

Circuit board testers are used for testing a variety of circuit boards or similar devices to assure that the circuit boards operate as intended. In at least one type of circuit board tester, such as Hewlett Packard Model No. 3070, Series 3, a separate device, referred to as a fixture, is used to position the circuit board such that a plurality of electrically conductive probes (which are part of, or coupled to, the tester) contact predetermined components or positions of the circuit board. The particular components or positions which are contacted by the test or probes depend on the tests which are desired. When the probes are in contact with the desired locations on the circuit board, electrical signals with predetermined parameters (e.g., predetermined magnitudes or patterns of current, voltage frequency, phase and the like are applied, by the tester, typically under control of a computer, to certain of the probes. Some or all of the probes are used to measure the performance or response of the circuit board (i.e., to measure electrical parameters of at some or all of the probes contacting the circuit board). In this way, it is possible to rapidly perform a number of tests or measurements characterizing the performance of the circuit board while simulating the conditions the circuit board would have, or could have, during actual use. Although it is possible to use these types of tests (and testing devices) for a variety of possible purposes (such as "spot checking" selected circuit boards at a production facility, testing circuit boards which may be malfunctioning, testing prototype circuit boards as part of a design program and the like), in at least some applications, circuit board testing is used to provide quality assurance on all or substantially all products of a given type or class which are produced by a company. Even with the relatively rapid test procedures which can be achieved by in circuit testing, it is not unusual for desired testing of each circuit board to require on the order of 30 seconds to 90 seconds or more.

Because, in at least some applications, circuit board testing is performed on substantially all devices on a production line or production facility, speed and reliability of testing can be especially important since delay or failure at a testing station can delay or interrupt the overall production in a production line or facility. Accordingly, it would be useful to provide a fixture, useable in connection with in-circuit testers, which provides desired speed of positioning the circuit board or other unit under test (UUT) and which achieves a relatively high degree of reliability, e.g., so as to avoid interrupting or delaying production rates at a production line or facility.

The effect of such testing on overall production rates is at least partially related to the rate at which each UUT can be placed in the fixture and the rate at which the fixture can accurately and reliably move the UUT to the desired position or positions. In at least some situations, it is desired to provide a tester with probes at two or more levels (with respect to a direction normal to the plane of the UUT) e.g., by providing some probes having a first height and other probes having a second height. This arrangement affords the opportunity to perform two or more different sets of tests such that the points at which probes contact the UUT during one set of tests are different from (or a subset of) the points at which probes contact the UUT during another set of tests. Typically, in such a "dual stage" testing situation, the UUT is first positioned so as to contact all probes (and perform a first set of tests), and then positioned to contact only the taller set of probes (at points of the UUT which are determined by the location of the tall probes) and a second set of tests are performed using only the taller probes. Although many different testing procedures can be used, as will be understood by those of skill in the art, in at least some situations, the taller probes may be used for functional tests and/or boundary scan tests (such as boundary scan tests as described in IEEE Standard No. 1149.1).

In at least one previous approach, the circuit board is moved in the direction of the probes, typically causing the taller probes, which may be provided with a spring-urged telescoping structure, to partially collapse or telescope, down to the level of the smaller probes, such that substantially both sets of probes (the taller probes and the shorter probes) contact the UUT at desired positions. With the board held in this position, a first set of tests (such as functional tests and/or boundary scan tests) can be performed. After tests are performed using the full set of probes the vacuum is released such that the UUT is positioned to contact only the taller probes (which telescope upwardly) and a second set of tests, (such as tests directed to measuring performance or characteristics of individual components on the UUT) can be performed.

In order for fixtures used in dual stage testing to operate well, especially in the context of a production line or facility, it is also desirable to avoid delays or malfunctions in moving the UUT between the stages. Accordingly, it would be desirable to provide a fixture, useable connection with dual stage in-circuit testing, with a relatively high degree of reliability and operating speed.

In at least one type of fixture, the force of atmospheric pressure is used to move the UUT towards the probes, e.g., by drawing a (partial) vacuum in a sealed area above or near the probes. In these devices, in order to accommodate dual stage testing, such fixtures have, in the past, been provided with a shuttle plate positioned in the area somewhere above the probes and defining one or more standoff structures which engage or contact a surface of the fixture (or of the UUT) to limit the amount of downward movement that the vacuum can effect on the UUT. In this way, the shuttle plate, in a first position, can cause the UUT to be positioned so as to contact only the taller probes. After a first set of test is performed, the vacuum is at least partially released and the shuttle plate is then moved, typically laterally, such that the standoffs slide against a surface of the fixture sufficiently to become aligned with notches or other openings, allowing the (reapplied) vacuum to pull the UUT down farther, so as to contact the full set of probes (so that a second set of tests can be performed). It is also possible to perform tests with the full set of probes before performing the tests using only the taller probes. In at least one previous device, a shuttle mechanism is located in the lid structure to hold the board down onto the long probes. This device requires pneumatic cylinders, and requires an additional operator connection of compressed air lines to the fixture.

While this arrangement can achieve dual stage positioning, it has been found that such a shuttle plate approach can lead to delays or failures in testing. For example, the shuttle plate approach can provide a relatively high amount of friction when the shuttle plate is moved laterally, particularly when components of the fixture are made of a G10 or similar relatively high-friction material. This can lead to binding (inability of the shuttle plate to move smoothly to the second position or return to the first position). Such binding can not only cause delays and slow down a production line or production facility but can cause failures which may require repairs or replacement of parts, thus creating a substantial interruption. of production. Accordingly, it would be useful to provide a fixture which can achieve dual stage testing while avoiding the type of binding, delay, failure, or interruption associated with the use of a shuttle plate.

In at least some systems, pneumatic actuators are used to move the UUT towards the probes. In these types of systems, the pneumatic actuators are configured and/or controlled so as to be movable among three positions, an initial position, a position with the UUT in contact with the taller probes and a position with the UUT in contact with all probes. Pneumatic systems, unfortunately, are associated with certain undesirable qualities. Unlike an atmospheric pressure system, which provides pressure spread over a substantial area, preferably over substantially the entire surface of the UUT, pneumatic systems generally provide pressure only at discrete locations. In general, this leads to a certain amount of flexure of the UUT as it is moved by the pneumatic actuators which can lead to poor contact with the probes in some locations of the UUT and, thus, inaccurate test results. Furthermore, pneumatic systems are generally relatively massive (e.g., such as resulting in fixtures weighing 40 to 50 pounds more than vacuum systems). Generally, this means that changing from one fixture to another (such as for routine maintenance, or to accomplish testing of a different type of UUT) will require two or more workers and/or lifting or positioning equipment, and will typically require more time than changing fixtures in a vacuum system, thus, leading to delays and/or interruptions in a production line or production facility. This is particularly true when the fixture is reinforced in an attempt to reduce the amount of flexure associated with pneumatic systems (although such reinforcement is, typically, only partially successful such that even reinforced systems may have an undesirable amount of flexure). Accordingly, it would be useful to provide a fixture which can be used for dual stage in-circuit testing which has a relatively low weight, e.g., compared with pneumatic-type fixtures, and/or imparts relatively little flexing on the UUT (e.g., compared with pneumatic-type fixtures), and otherwise achieves a low amount or probability of delays or interruptions.

SUMMARY OF THE INVENTION

The present invention includes a recognition of the existence, nature and/or source of problems found in previous approaches, including as described herein.

Initially, the UUT, typically supported on a support plate which has perforations corresponding to the probe positions, is held spaced from all of the probes, e.g., by one or more springs. According to one aspect, the present invention uses atmospheric pressure (by drawing a vacuum in the region adjacent the probes) to move the UUT (against one urging of the springs) into a position contacting all of the probes (i.e., both the short probes and the long probes). Such use of atmospheric pressure as a moving force reduces or substantially eliminates flexing of the UUT. In one aspect, in order to move the UUT to a second position, contacting only the tall probes, the vacuum is substantially released but a (preferably actuateable and/or controllable) structure limits the distance the UUT can travel away from the probes (under urging of the springs) so as to position the UUT at the desired location, contacting only the tall probes. Because this movement does not require the lateral sliding of a shuttle plate (or its components), e.g., against a high-friction surface and/or because this movement does not require relative sliding or other contact movement while components are pressed together by atmospheric pressure forces (since the vacuum has already been released, at least partially). There is relatively little tendency for binding during such movement and thus dual stage testing can be achieved with relatively low incidence or probability of delay or failure.

In one embodiment, the motion-limiting member includes a substantially (laterally-extending member which can be in a first position (so as to clear the support plate and/or UUT and/or "lid", to permit substantially free movement of the UUT toward the first position). The motion-limiting member can be placed in a second position or configuration (such as by rotating or extending the laterally-extending member) so as to engage a surface of the UUT, support plate or lid (or to engage a surface of a ledge formed therein) to limit motion, as described.

BRIEF DESCRIPTION OF THE DRAWINGS

FIGS. 11A–E are partial cross-sectional views through a fixture at five successive stages of operation, according to an embodiment of the present invention.

DETAILED DESCRIPTION OF THE PREFERRED EMBODIMENTS

Figure 1:
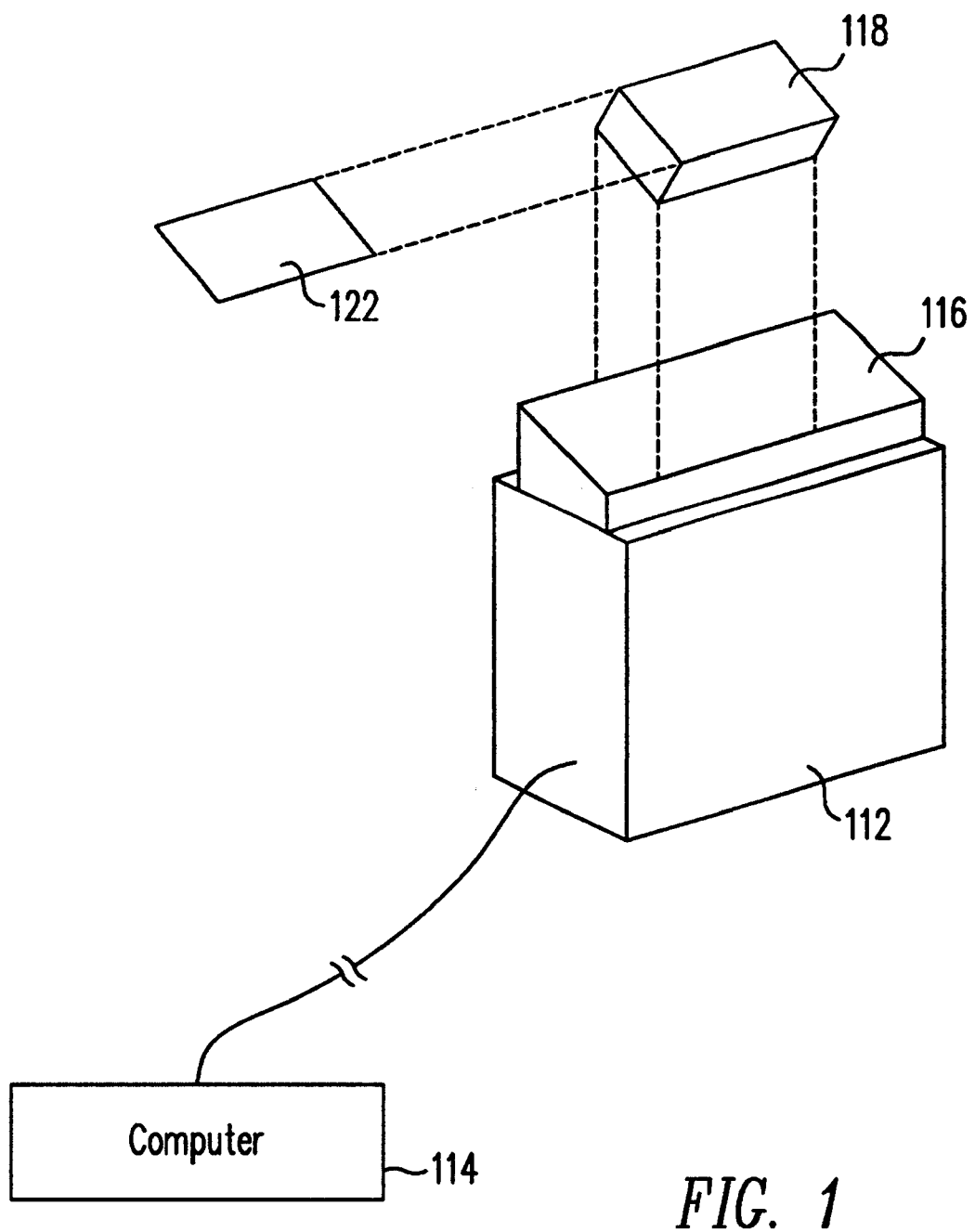
FIG. 1 is a generalized perspective partially exploded view of a tester, fixture and unit under test (UUT)

As depicted in FIG. 1, a circuit board test device 112 is typically coupled to a computer 114 for controlling and performing tests, and storing test results, and includes a bed region 116. A fixture 118, (e.g., as described more thoroughly below), receives a circuit board or other unit under test (UUT) 122. The fixture 118 is positioned on the bed 116 so that once the probes contact the UUT, the tester 112 can perform the desired tests. A number of testers can be used in conjunction with embodiments of the present invention, including, e.g., Hewlett-Packard Model 3070.

Figure 2:
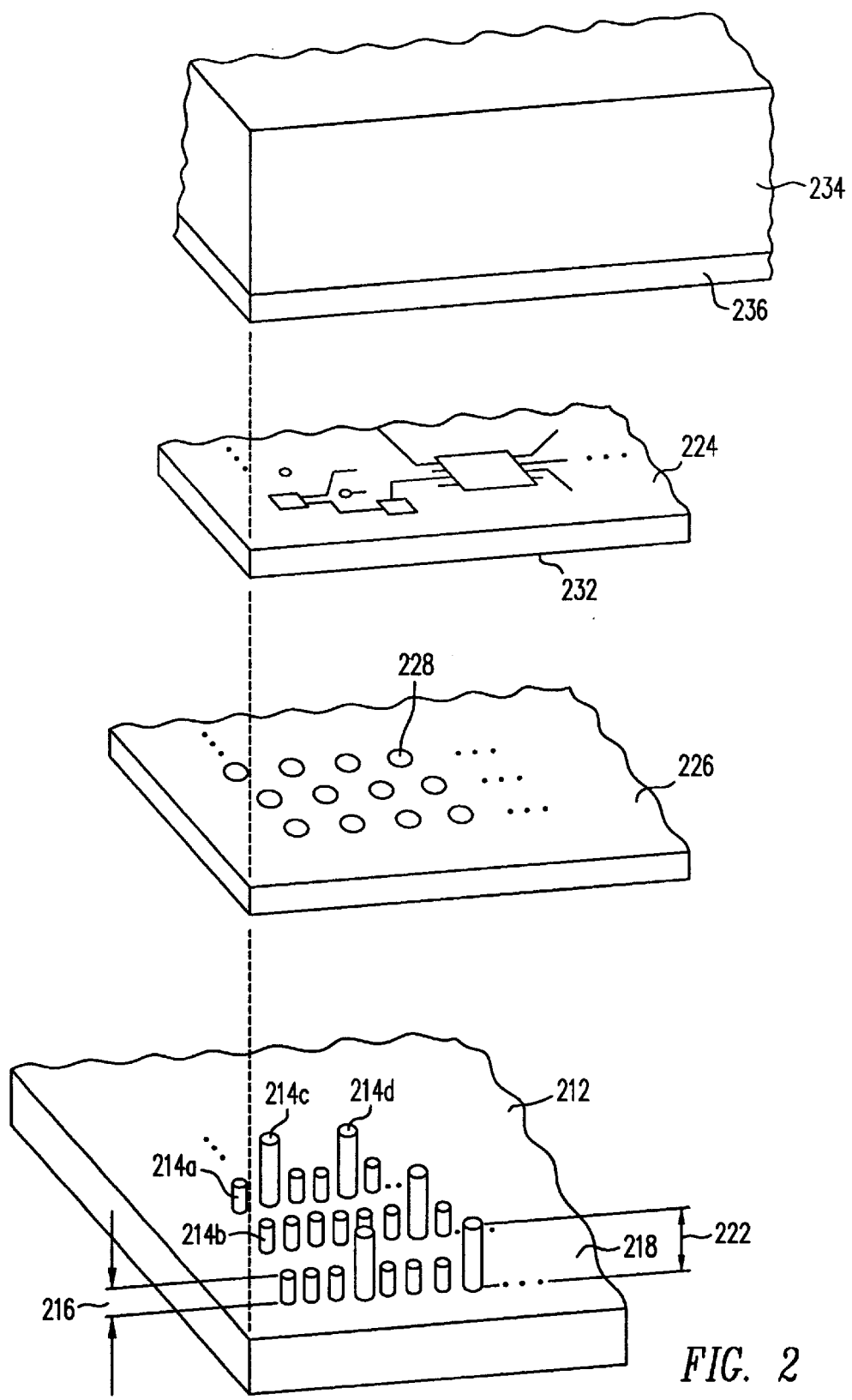
FIG. 2 is a simplified perspective, partially exploded, view of a fixture showing relative positions of a probe plate, a support plate, a UUT and a lid.

Typically, the fixture 118 includes a probe plate 212 (FIG. 2) configured to accommodate probes 214 extending therethrough. The probes 214, in the depicted configuration, include both short probes such as 214a,b and longer probes such as 214c,d. For clarity of illustration, the components of the figures are not necessarily shown to scale. Typically, the probes 214a,b will be positioned in a dense array. Although probes typically have predefined dimensions and configurations in at least some current devices, the present invention can be used in a wide variety of contexts including in devices having more or fewer probes, more dense or less dense probe arrays, larger, taller or shorter probes, (compared to current devices) and the like as will be understood by those of skill in the art.

Typically, the UUT 224 rests on a support plate 226 which contains a plurality of perforations 228 aligned with the probes 214 to permit passage therethrough so the probes 214 can contact predetermined locations on the UUT 224. Although, in the view of FIG. 2, only the upper surface of the UUT 224 is depicted, the lower surface 232, which is the surface that will contact the probes 214, will have a variety of printed or other wires and discrete components (such as integrated circuits or "chips" and their carriers). Typically, the system will be configured, with respect to a particular model or type of UUT 224, so that the probes 214 will contact selected wires or other conductors on the UUT needed for performing various tests. A cover or lid 234, preferably positioned with a gas-impermeable gasket 236 can be provided to at least partially assist in maintaining a vacuum in desired regions, as described below.

Figure 3A:
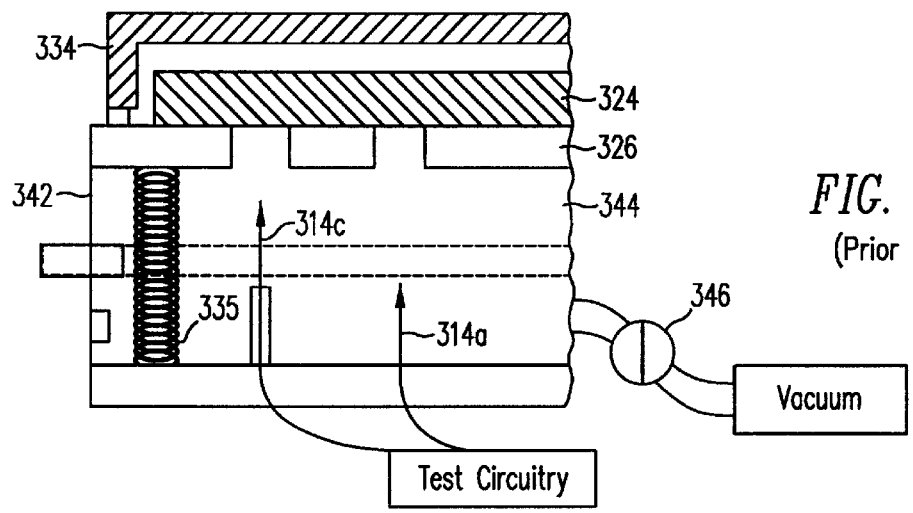
FIGS. 3A, B & C are generalized cross-sectional views of a dual stage vacuum-type system at three positions according to previous approaches.
Figure 3B:
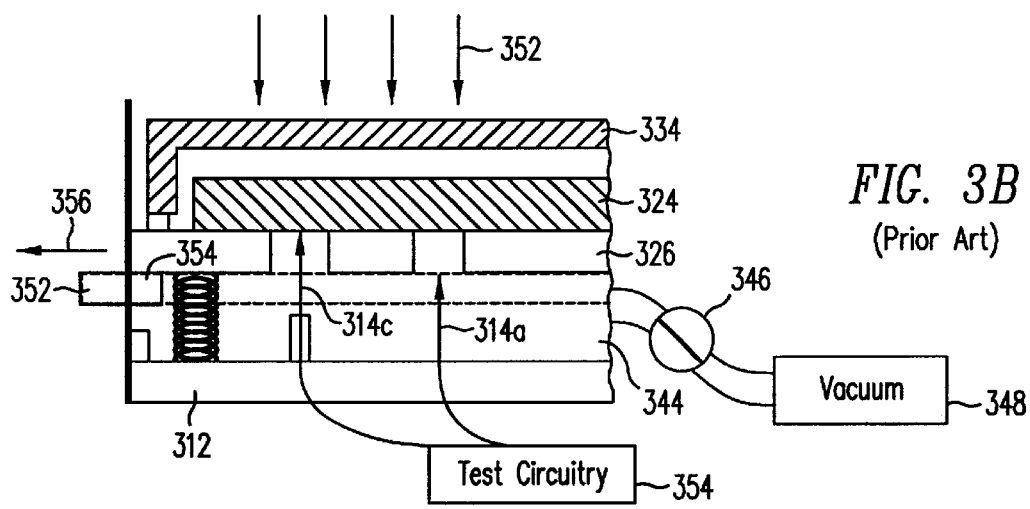

Before describing certain aspects of the present invention, various aspects of previous approaches will first be described. In the configuration of FIG. 3A, the fixture is in the open or relaxed position with the UUT 324, supported on the support plate 326, being spaced from the both the tall probes 314c and the short probes 314a. The support plate 326, UUT 324 and lid 334 are urged to this position by a spring 335 or other urging device. A number of types of springs or similar devices can be used including, for example, helical springs, leaf springs and compressible materials such as resilient rubber or plastic. The lid 334, in combination with a side wall 342 forms a sealed region in the area of the probes 344. When the vacuum valve 346 is changed from the closed position (FIG. 3A) to the opened position (FIG. 3B), the sealed area 344 is in communication with the vacuum 348 and a partial vacuum is drawn in the sealed area 344 such as about 500–900 millibars below atmospheric pressure. As a result, atmospheric pressure provides a downward force substantially evenly across the upper surface of the fixture. As a result, the support plate 326, UUT 324 and lid 334 move downward, i.e., in a direction toward the probe plate 312. A shuttle plate 352 is positioned in a first lateral configuration, as depicted in FIG. 3B, such that a portion of the shuttle plate will form a stop 354 which contacts the support plate 326 when the UUT 324 is in a desired first position with the tall probes 314c contacting the UUT 324, and the short probes 314a spaced from the UUT. In this configuration, the test circuitry 354 is used to perform the desired test using the tall probes 314c. After a first set of tests are performed, the shuttle plate 352 is moved laterally 356 so that the stop 354 clears its support plate 326 as seen by comparing FIG. 3D with FIG. 3C, such lateral movement 356 of the shuttle plate 352 requires the upper surface of the stop 354 to slide against the lower surface of the support plate 326. It has been found that a relatively large amount of friction, opposing this sliding movement, can develop. Accordingly, it is not uncommon for such fixtures to experience binding which can delay or prevent the desired lateral movement 354 of the shuttle plate 352.

Figure 3C:
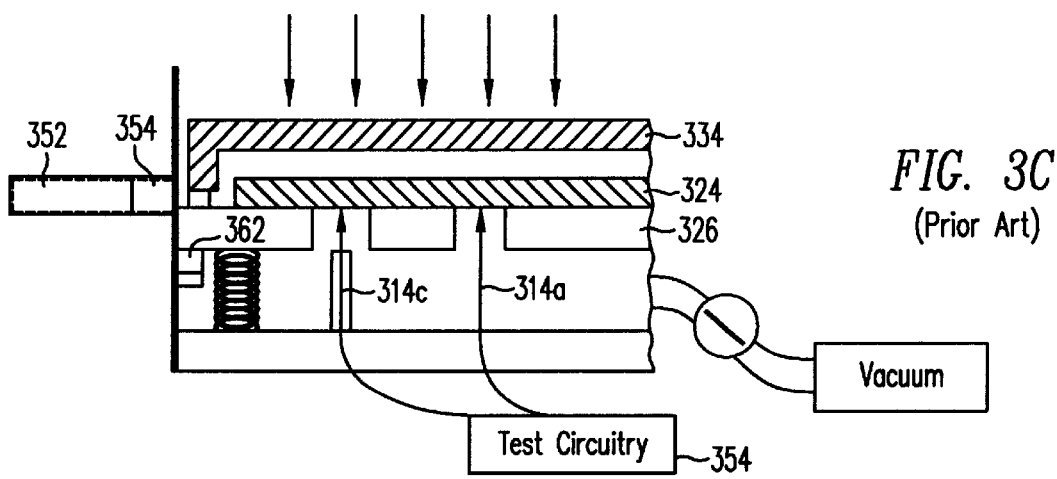

If and when the shuttle plate 352 is moved to a second position, as depicted in FIG. 3C, such that the stop 354 clears the support plate 326, the support plate 326, UUT 324 and lid 334 are free to move further downward so as to contact a fixed stop member 362, at which time the UUT 324 is positioned to contact both the tall probes 314c (which are now telescoped downwardly to have the same height as the short probes) and the short probes 314a. In this position, the test circuitry 354 can be used to perform a second set of probes test using both the tall probes 314c and the short probes 314a.

Figure 4A:
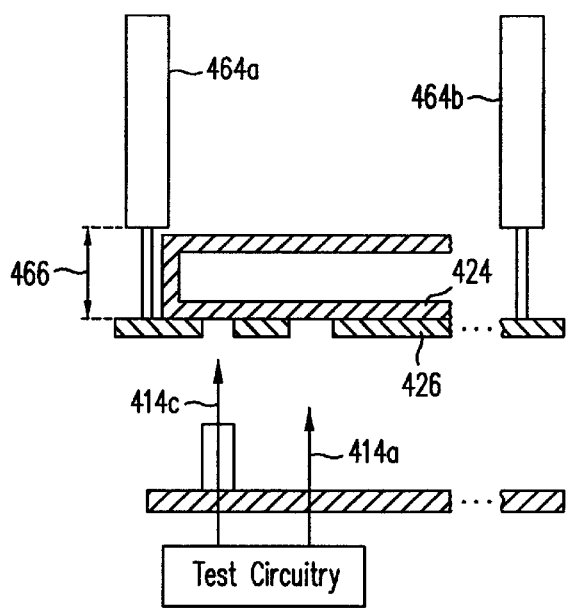
FIGS. 4A, B & C are generalized cross-sectional views of a pneumatic-type fixture at three positions according to previous approaches.
Figure 4B:
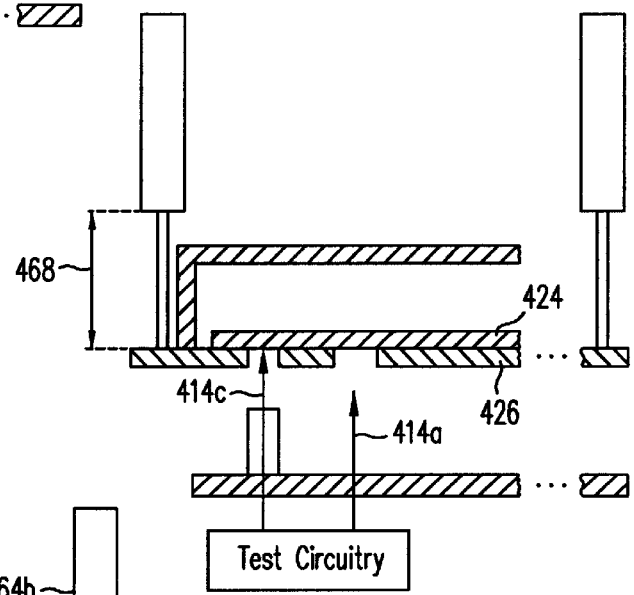
Figure 4C:
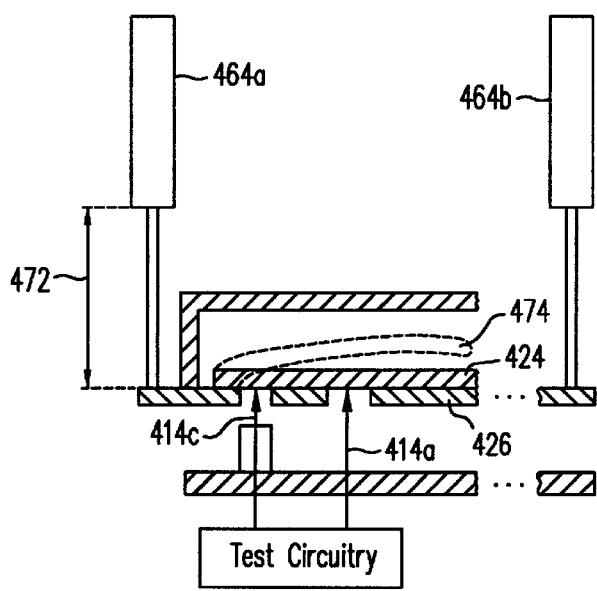

In a pneumatic fixture of the type depicted in FIG. 4A, pneumatic cylinders 464a,b are coupled to the support plate 426. The cylinders 464a,b are configured so that they can be controllably placed in the first configuration, as illustrated in FIG. 4A, with the cylinder arm extended a first distance 466 so as to position the UUT 424 spaced from both the tall probes 414c and the short probes 414a. In a second configuration as illustrated in FIG. 4B, the pneumatic cylinders are configured to extend the arms a second distance 468, greater than the first distance, such that the UUT 424 is positioned to contact the tall probes 414c, but not the shorter probes 414a. The pneumatic cylinders 464a,b can also be positioned to extend the arms a third distance 472, greater than the second distance 468, such that the UUT 424 is positioned as to contact both the tall probes 414c (which, in this configuration, have been telescoped downward to have the same height as the short probes) and the short probes 414a. It has been found that use of pneumatic fixtures, e.g., as depicted in FIGS. 4A–4C typically results in a certain amount of flexure 474 (exaggerated in FIG. 4C, for clarity) which can result in poor contact of the UUT 424 with some or all of the probes 414c, 414a, and is otherwise undesirable for test purposes. Additionally, the pneumatic cylinders and other components of a pneumatic system are typically sufficiently heavy that the pneumatic-type fixtures can only be installed, removed or otherwise manipulated by using two or more persons and/or additional equipment (compared to, e.g., vacuum systems as depicted in FIGS. 3A–3C).

Figure 5:
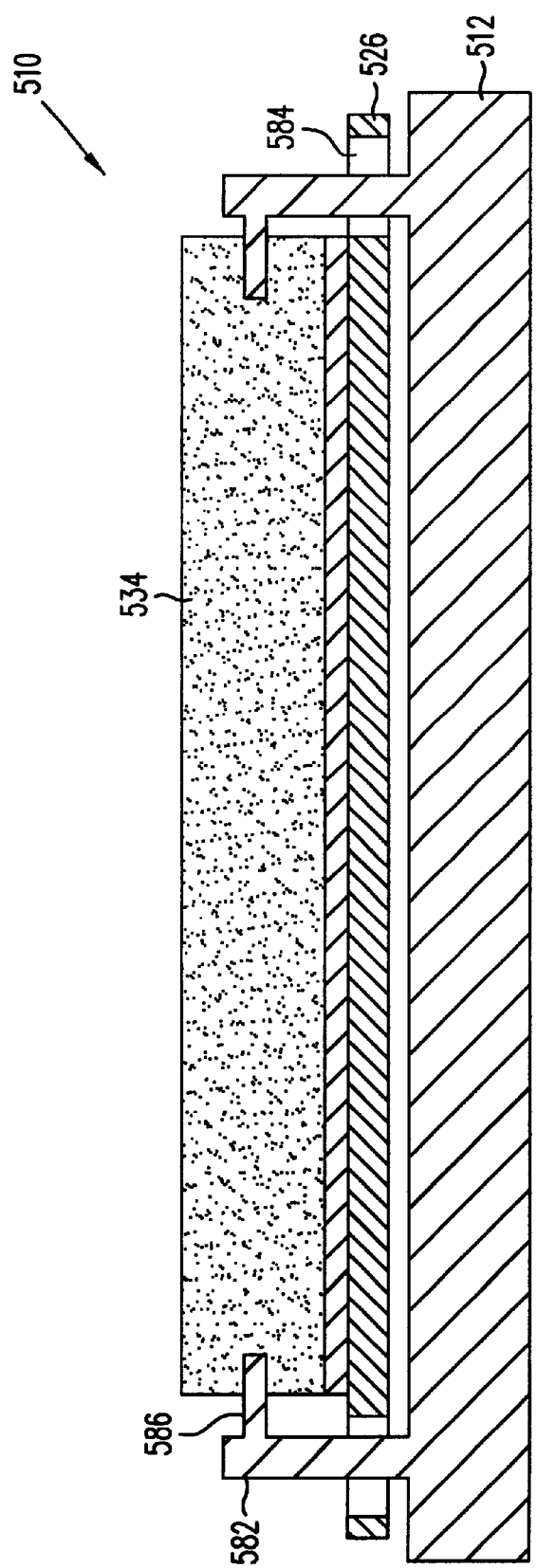
FIG. 5 is a cross-sectional view through a fixture according to an embodiment of the present invention.
Figure 6:
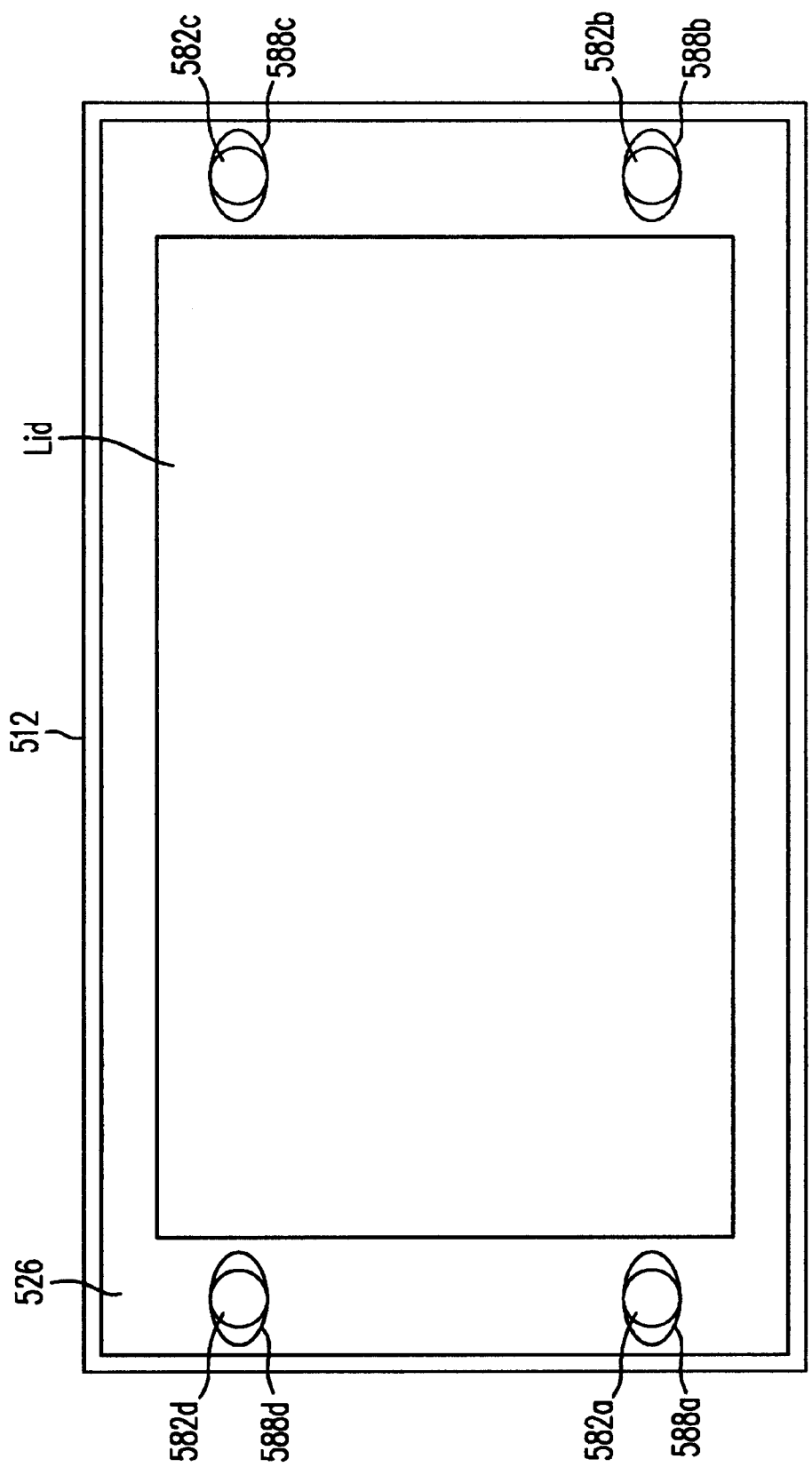
FIG. 6 is a top plan view of the fixture of FIG. 5.

According to one embodiment of the present invention, as depicted in FIG. 5, a fixture 510 can be provided with a motion-limiting member such as an actuator 582 coupled to a probe plate 512. The actuator, in the embodiment of FIG. 5, extends through a cut-out 584 in the support plate 526 and has an arm 586 which can engage, e.g., the lid member 534, when and as desired. As seen in FIG. 6, preferably the actuators ABCD are placed near the four corners of the support plate 526 and extend through corresponding cut-outs 588a,b,c,d.

Figure 7:
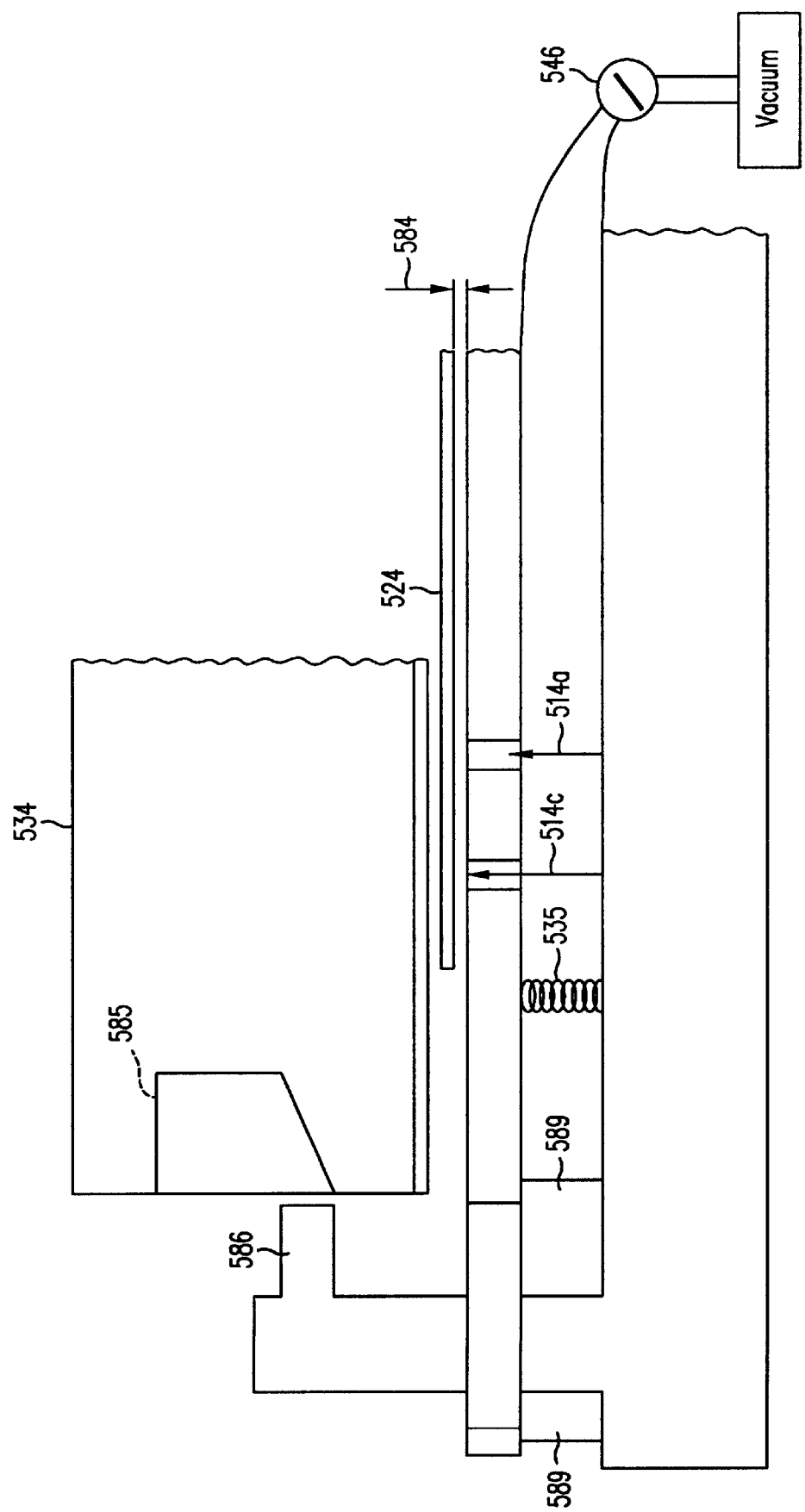
FIG. 7 is an enlarged partial cross-sectional view through a fixture, according to an embodiment of the present invention, in the relaxed position with the probes not contacting the UUT.

As depicted in FIG. 7, in a relaxed or spaced configuration, there is no vacuum adjacent the probes 514a,c and the UUT 524 is spaced 584 from the probes 514c. In the configuration of FIG. 7, the arm 586 is in the withdrawn configuration and is spaced from a cut-out 586 formed in the lid 534. A gasket 588 forms a seal with respect to the cut-out 588 to assist in forming a partial vacuum as described below.

To initiate testing, a vacuum valve 546 is opened, forming a vacuum in the region above the probe plate 512, and in the area of the probes such that atmospheric pressure, which is substantially even over the upper surface of the lid 534, causes a downward force 552 moving the support plate 526, UUT 524 and lid 534 downward to a lower most position such that both the shorter probes 514a and the longer probes 514c (which are now telescoped down to the same level as the shorter probes) contact the lower surface of the UUT 524 in the desired locations. In this configuration, the test circuitry 554 can be used to perform a plurality of tests using both the sort probes 514a and long probes 154c.

Figure 8:
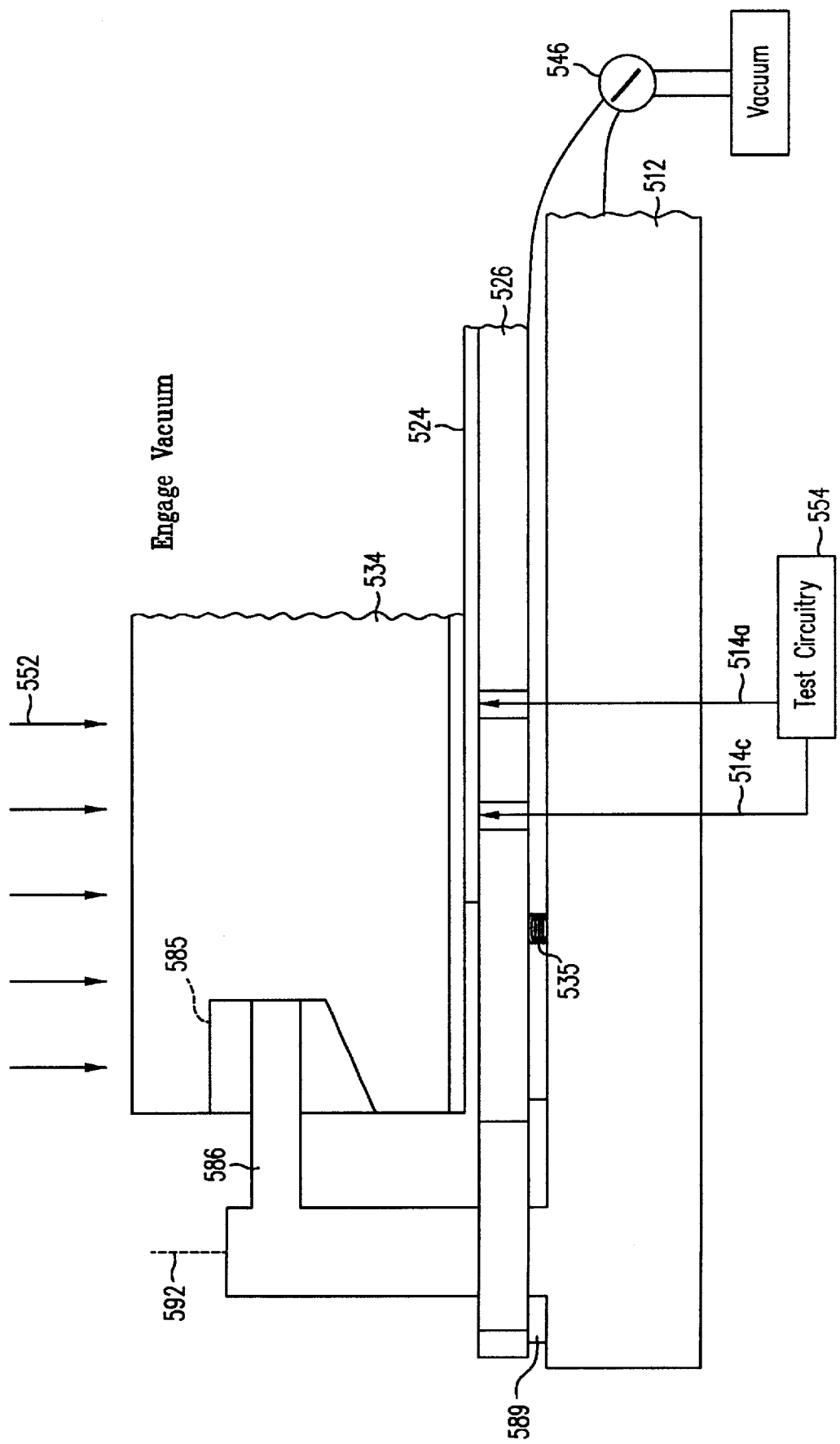
FIG. 8 is a cross-sectional view corresponding to the view of FIG. 7, but after the vacuum has been engaged so as to contact the UUT with all probes.
Figure 9:
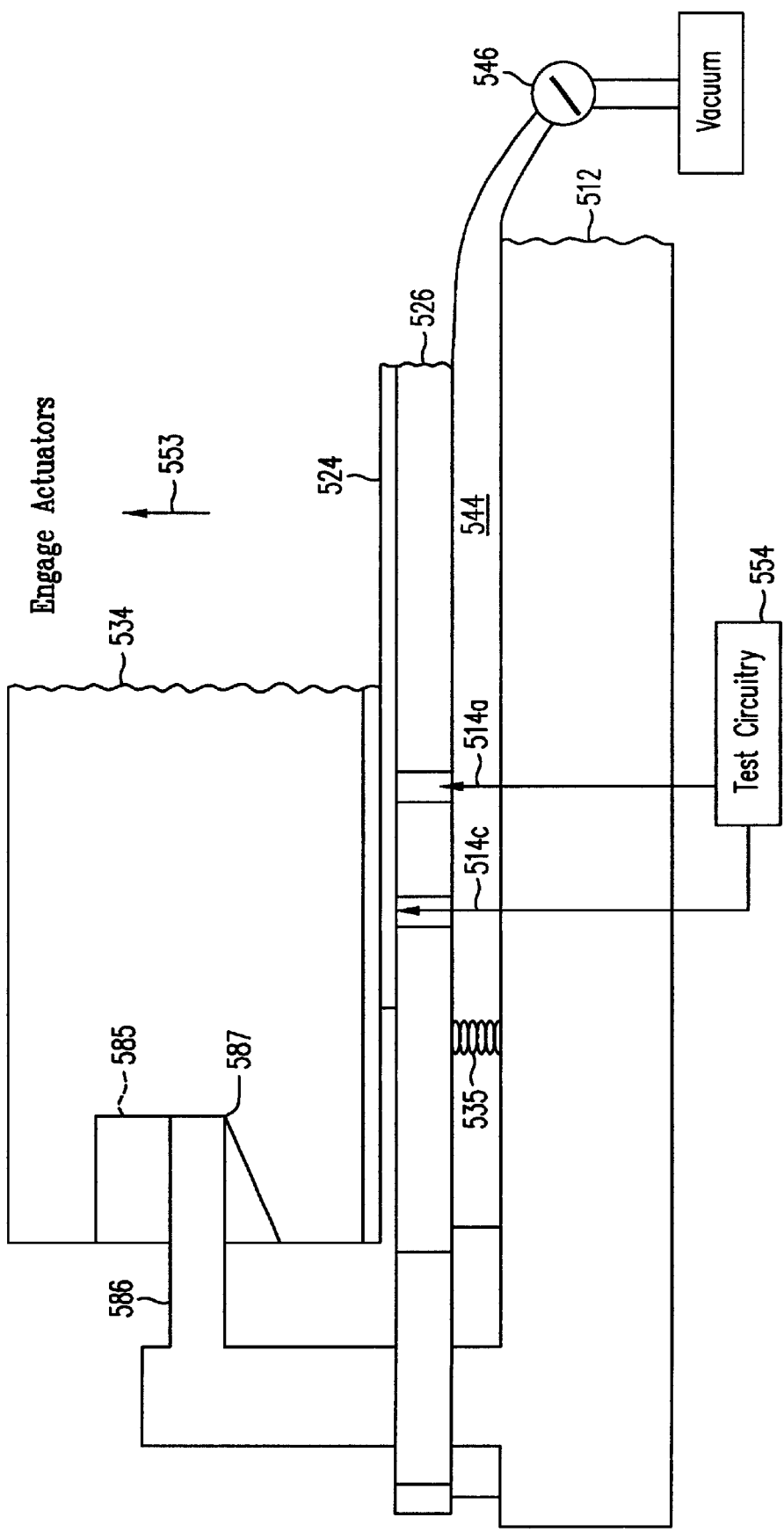
FIG. 9 is a cross-sectional view corresponding to the view of FIG. 8, but after the actuator has been engaged and the vacuum has been released so as to position the UUT to contact only the tall probes.

While the fixture is in the configuration of FIG. 8, the arm 586 can be extended outwardly to the configuration depicted in FIG. 8 so as to enter and/or engage the pocket or recess 585 formed in the lid 534. A number of devices can be used to achieve effective extension of the arm 586. The arm 586 can be a laterally or linearly extendable device such as a pneumatic device, an electrically or electronically operated and controlled linear actuator and the like. Alternatively, the arm 586 can be formed having a constant length with the actuator post being rotatable about its longitudinal axis 592 to rotate the arm 586 from a position as depicted in FIG. 7 to a position as depicted in FIG. 8. Other devices for effectively engaging or disengaging with the lid 534, or similar structure, will be understood by those of skill in the art after understanding the present invention. Those of skill in the art will understand how to use electrical or electronic control, pneumatic control, computer control and the like for engaging or disengaging the actuator arm 586 at the desired times, such as under control of a computer.

With the arm 586 extended, the vacuum valve 546 is moved to the closed position and the sealed region 544 above the probe plate 512 is vented to the atmosphere. With the equalization of pressure of the sealed area 544 to atmospheric pressure, the spring 535 and/or compressed gasket 588 urge the support plate 526, UUT 524 and lid 534 upward 553 (away from the probe plate 512) until the arm 586 reaches the corner 587 of the pocket 585, preventing any further upward movement, and holding the UUT 524 in a position, as depicted, such that the (now untelescoped) tall probes 514c contact the UUT 524 while the shorter probes 514a are spaced from the UUT 524. In this configuration, the test circuitry 554 can be used to perform a second series of tests, using only the tall probes 514c. After all desired tests are performed, the arm 586 can be withdrawn (to the configuration depicted in FIG. 7) allowing the spring 535 to urge the fixture back to the opened or relaxed configuration shown in FIG. 7, whereupon the UUT 524 can be removed and replaced with a new UUT, for testing the new UUT.

Figure 10A:
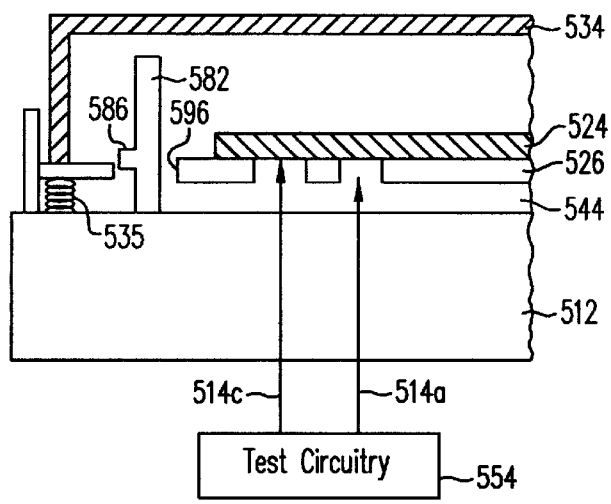
FIGS. 10A, B & C are cross-sectional views generally corresponding to the views of FIGS. 7, 8 and 9 respectively, but showing an embodiment of the invention in which the motion-limiting member is maintained within the sealed vacuum area during operation.
Figure 10B:
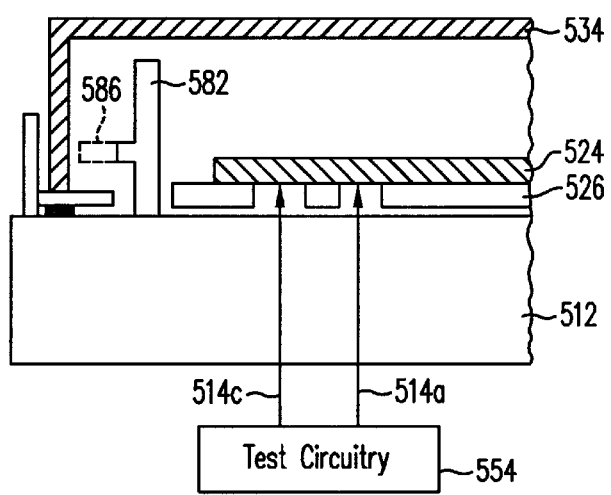
Figure 10C:
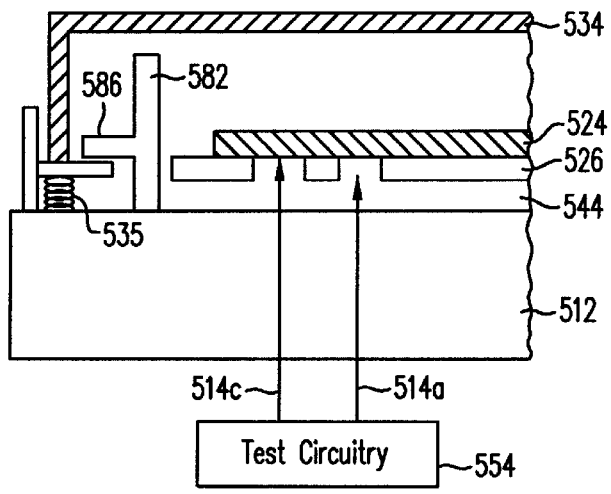

FIGS. 10A,B & C depict another embodiment of the invention. Whereas in the embodiment of FIGS. 5–9 the actuator post 582 is substantially outside the sealed area 544 (and is sealed therefrom by gasket 588). In the embodiment of FIGS. 10A–10C, the actuator 582 is substantially entirely positioned within the sealed area 544. This eliminates the need for the gasket 588. Furthermore, positioning at least some of the moving parts such as the actuator 582 within the region defined by the lid 534 reduces or eliminates the likelihood that an operator may place his or her fingers in a region that could cause injury, from moving parts.

Additionally, in the embodiment of FIGS. 10A,B,C, the actuator arm 582 is configured to extend laterally in a direction away from the UUT 524 (i.e. to the left, in the view of FIGS. 10A, B & C) and to contact an upper surface of the support plate 526 rather than a pocket in the lid. Thus, as seen in FIG. 10A, when the arm 586 is retracted, it can clear an opening 596 in the support plate 526 allowing the support plate to be moved, by atmospheric pressure (as described above) to the lower most position depicted in FIG. 10B. While in this position, the arm 586 can be extended outwardly (as depicted in phantom in FIG. 10B) such that when the vacuum is released, the upward movement of the support plate 526 (and the UUT 524), under the urging of spring 535, will be stopped by contact of the lower surface of the arm 586 with the upper surface of a portion of the support plate 526, as shown in FIG. 10C.

Figure 11A:
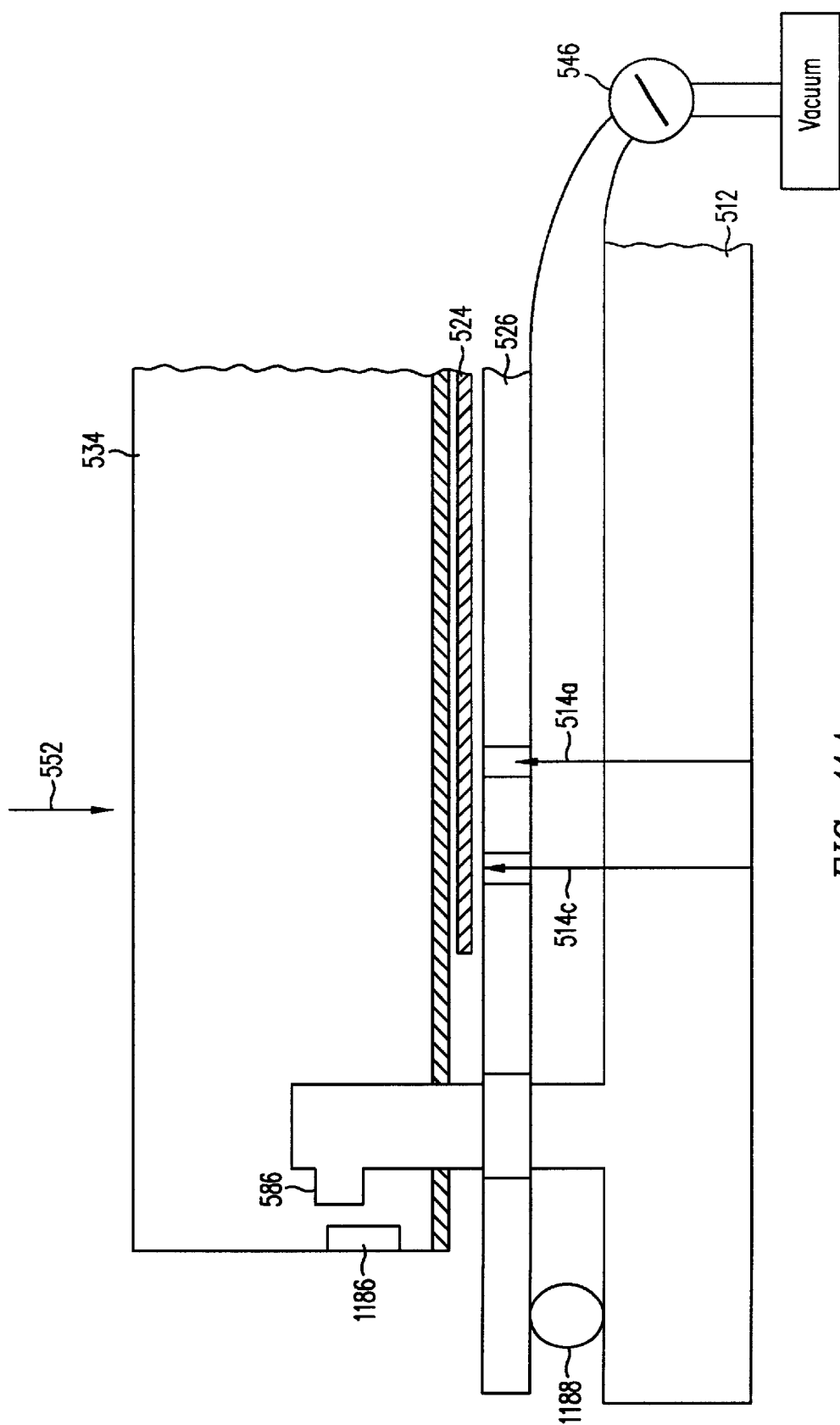

As depicted in FIG. 11A, in a relaxed or spaced configuration, there is no vacuum adjacent the probes 514a,c and the UUT 524 is spaced 584 from the probes 514a,c. In the configuration of FIG. 11A, the arm 586 is in the withdrawn configuration and is spaced from a ledge 1186 formed in the lid 534. A gasket 1188 forms a seal with respect to the support plate 526 to assist in forming a partial vacuum as described below.

To initiate testing, a vacuum valve 546 is opened, forming a vacuum in the region above the probe plate 512, and in the area of the probes such that atmospheric pressure, which is substantially even over the upper surface of the lid 534, causes a downward force 552 moving the support plate 526, UUT 524 and lid 534 downward to a lowermost position, as depicted in FIG. 11B such that both the shorter probes 514a and the longer probes 514c (which are now telescoped down to the same level as the shorter probes) contact the lower surface of the UUT 524 in the desired locations. In this configuration, the test circuitry 554 can be used to perform a plurality of tests using both the sort probes 514a and long probes 154c.

Figure 11C:
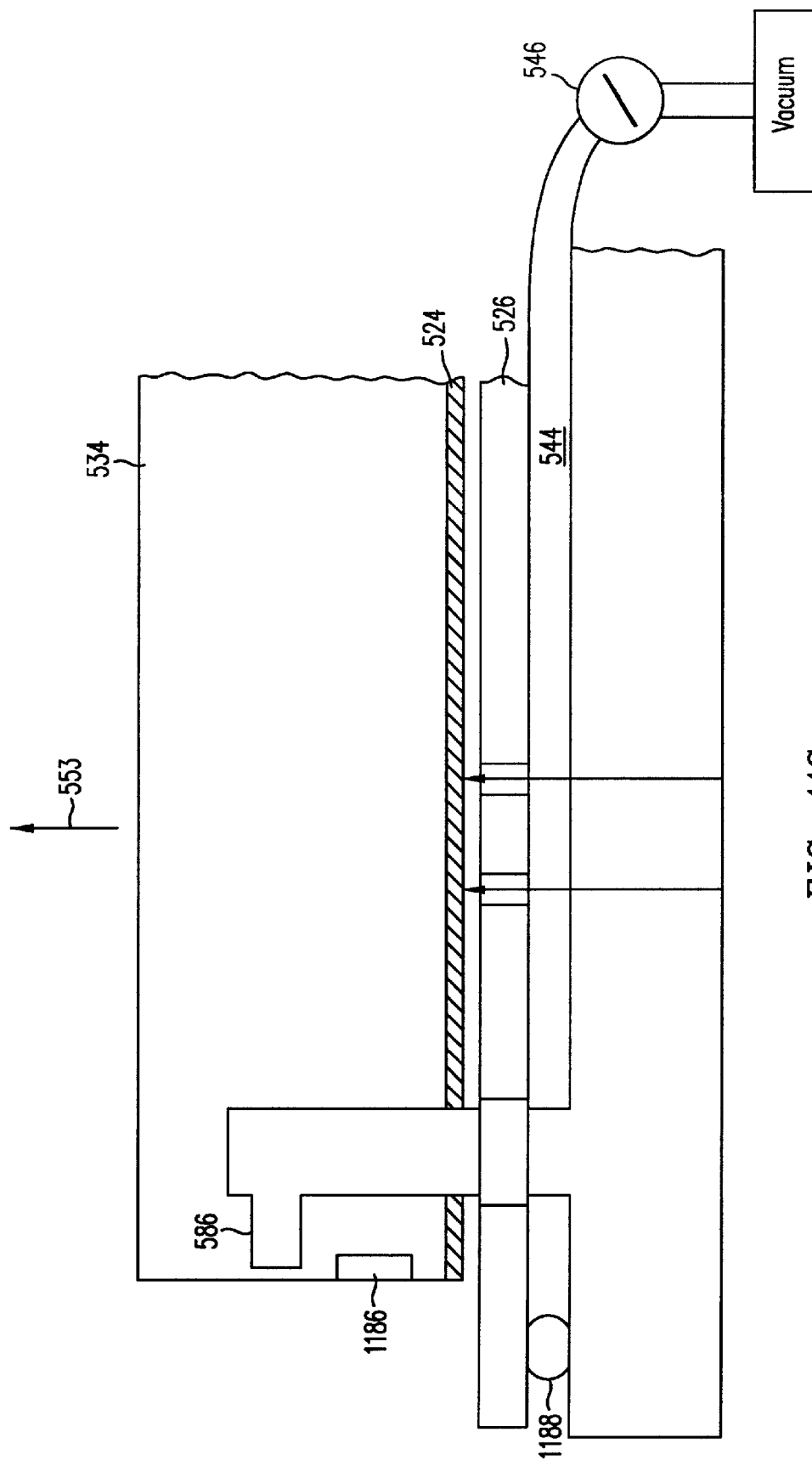

While the fixture is in the configuration of FIG. 11B, the arm 586 can be extended outwardly to the configuration depicted in FIG. 11C so as to extend above the shelf 1186 formed in the lid 534. Those of skill in the art will understand how to use electrical or electronic control, pneumatic control, computer control and the like for engaging or disengaging the actuator arm 586 at the desired times, such as under control of a computer.

Figure 11D:
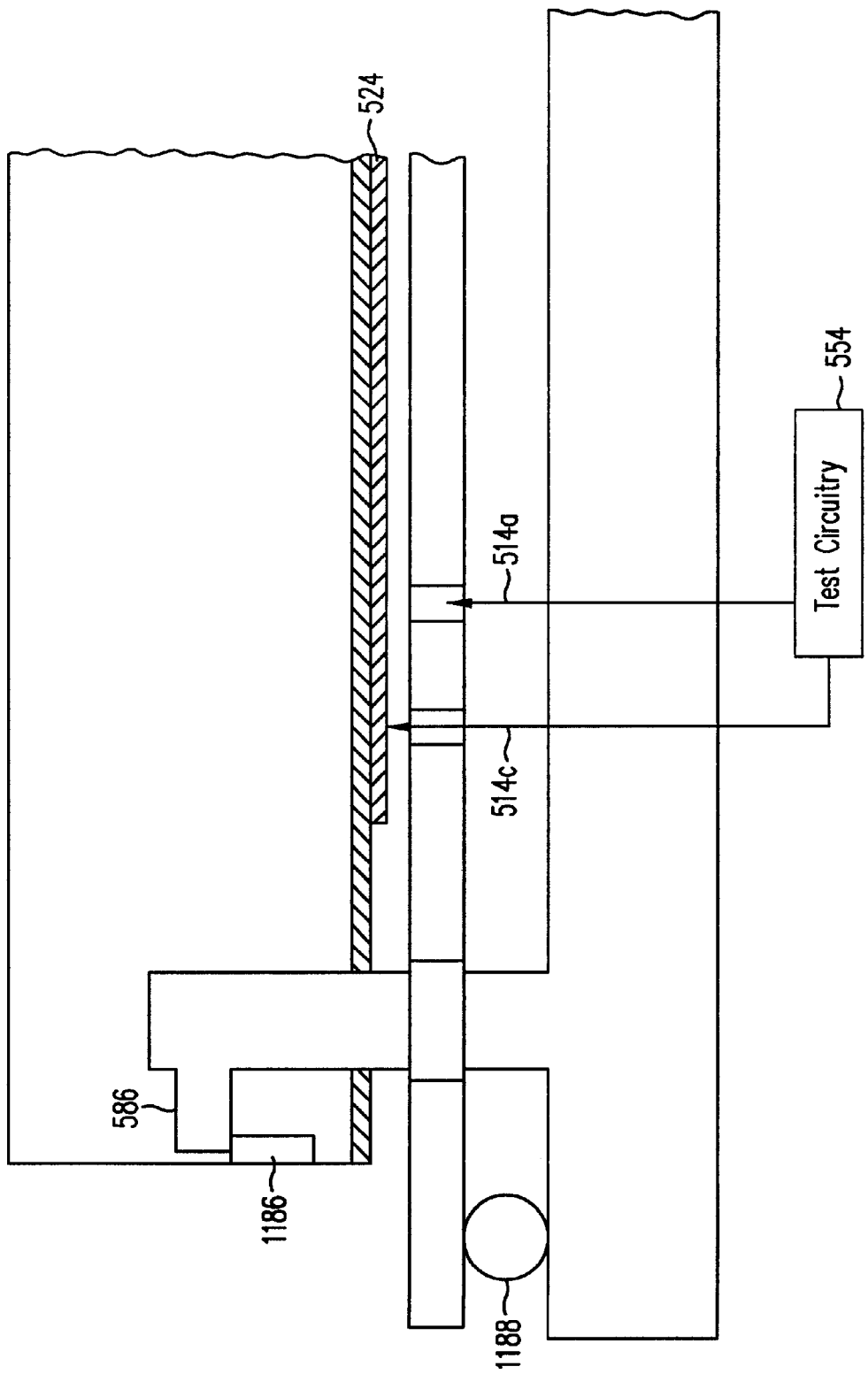
Figure 11E:
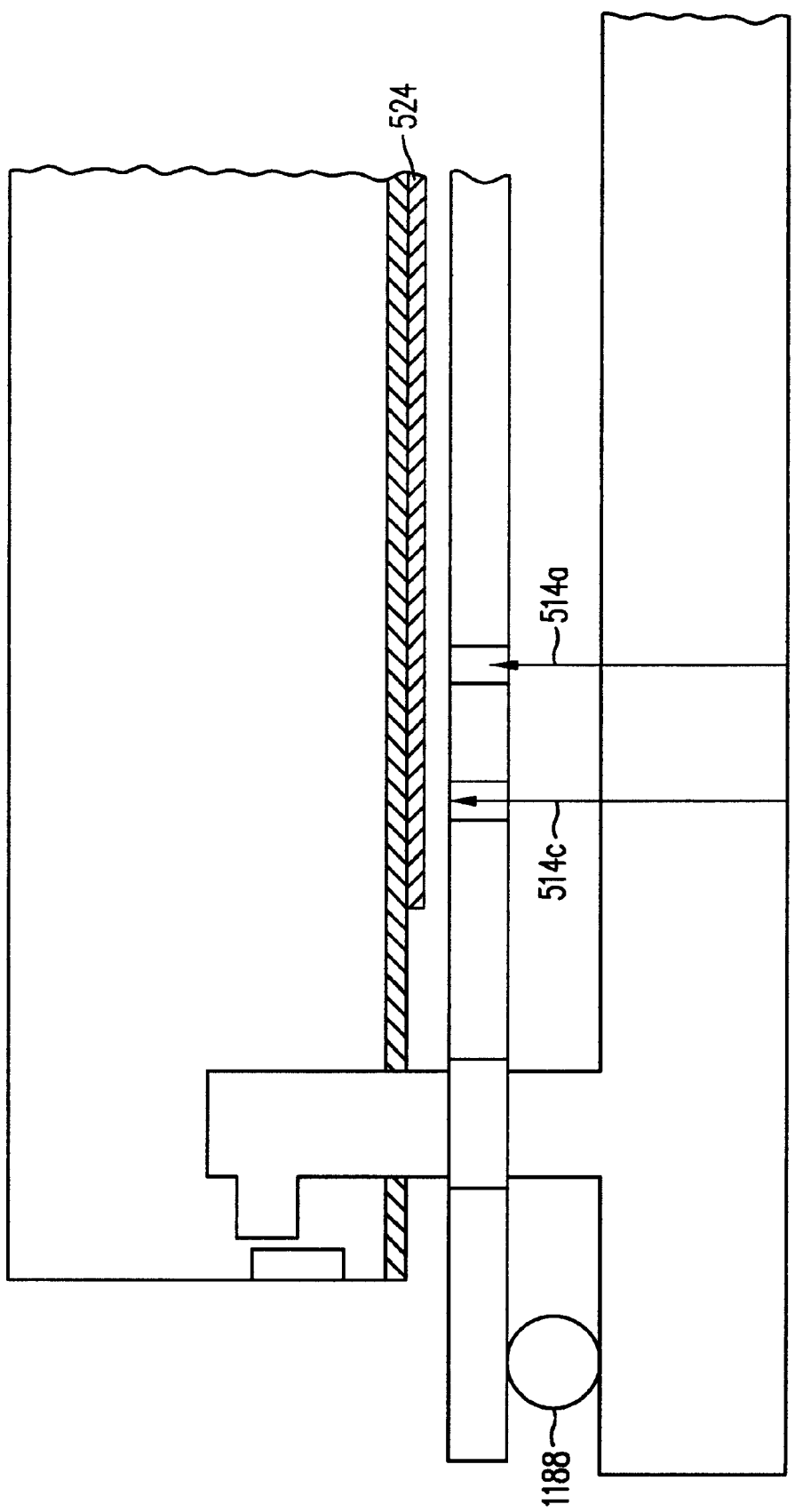

With the arm 586 extended, the vacuum valve 546 is moved to the closed position and the sealed region 544 above the probe plate 512 is vented to the atmosphere. With the equalizatioln of pressure of the sealed area 544 to atmospheric pressure, the compressed gasket 1188 urges the support plate 526, UUT 524 and lid 534 upward 553 (away from the probe plate 512) until the upper surface of the ledge 1186 reaches the arm 586, as depicted in FIG. 11D, preventing any further upward movement, and holding the UUT 524 in a position, as depicted, such that the (now untelescoped) tall probes 514c contact the UUT 524 while the shorter probes 514a are spaced from the UUT 524. In this configuration, the test circuitry 554 can be used to perform a second series of tests, using only the tall probes 514c. After all desired tests are performed, the arm 586 can be withdrawn (to the configuration depicted in FIG. 11E) allowing the gasket 1188 to urge the fixture back to the opened or relaxed configuration shown in FIG. 11E, whereupon the UUT 524 can be removed and replaced with a new UUT, for testing the new UUT.

A number of variations and modifications of the invention can be used. It is possible to use some of the aspects of the invention without using others. For example, it is possible to use an actuator to limit upward movement of the UUT, following a test which uses all probes, without using atmospheric pressure as the sole force for moving the UUT. It is possible to provide a vacuum/atmospheric pressure system with an engageable or controllable stop, following release of the vacuum (in order to position the UUT for a second set of tests) without requiring that the short-probe tests must be performed prior to the long-probe tests. Although movement or actuation of the motion-limiting member has been described as being performed electrically or electronically, such as under control of a computer, it is also possible to use or permit manual or mechanical actuation of the motion-limiting member. Although the present invention has been described in the context of dual stage test fixtures, there is no theoretical reason why the present invention cannot be used to perform multiple stage (e.g., two stage, three stage, or more) testing, e.g., by providing three or more levels of test probes and actuators which position the UUT (e.g., after full or partial vacuum release) to provide three or more positions (corresponding to the probe levels) for performing testing at each level. For example, each actuator could be configured to engage or disengage, selectably and controllably, with different notches or ledges to control the amount of release, and thus the level of the board, or different sets of actuators, each with its own corresponding notches or ledges, can be sequentially used or activated. Although the depicted apparatus shows an actuator arm 586 which engages the lid 534, it is possible to provide embodiments of the invention in which an engagement is formed with the support plate 526 and/or UUT 524. Although the depicted embodiments show the actuator arm 586 engaging a ledge or pocket formed in the lid 534, it is also possible for an actuator arm 586 to engage other surfaces, including upper or lower surfaces of fixture components.

In light of the above description a number of advantages of the present invention can be seen. The present invention can provide for moving a UUT to at least two different levels, for performing dual stage in-circuit testing, while reducing or avoiding the occurrence of testing delays or interruptions, (including those that can arise from frictional or other binding of moving parts), can provide for relative rapid testing and relatively rapid installation and removal of fixtures, can provide for a relatively low-weight fixture, e.g., as compared with typical pneumatic fixtures, and/or can avoid or reduce UUT flexure during testing.

The present invention, in various embodiments, includes components, methods, processes, systems and/or apparatus substantially as depicted and described herein, including various embodiments, subcombinations, and subsets thereof. Those of skill in the art will understand how to make and use the present invention after understanding the present disclosure. The present invention, in various embodiments, includes providing devices and processes in the absence of items not depicted and/or described herein or in various embodiments hereof, including in the absence of such items as may have been used in previous devices or processes, e.g. for improving performance, achieving ease and or reducing cost of implementation. The present invention includes items which are novel, and terminology adapted from previous and/or analogous technologies, for convenience in describing novel items or processes, do not necessarily retain all aspects of conventional usage of such terminology.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g. as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. Apparatus which can position a unit under test (UUT) for contact with at least a first plurality of tall probes or at least a second plurality of short probes, comprising:
   a support member configured to support said UUT, said support member being movable between at least an upper position where said UUT is spaced from said tall probes and said short probes, an intermediate position where said UUT contacts said tall probes and a lower position wherein said UUT contacts said tall probes and said short probes; and
   an activatable latch, including an arm member movable between at least a first configuration, where said arm member is disengaged from a first structure to allow said support member to move toward said lower position, and a second configuration where said arm member is engaged with said first structure to restrict movement of said support member to a position from said lower position to said intermediate position.

2. Apparatus, as claimed in claim 1, wherein said UUT comprises a circuit board.

3. Apparatus, as claimed in claim 1, wherein said arm member of said activatable latch, when in said second configuration, can engage said first structure comprising a surface of said support member.

4. Apparatus, as claimed by claim 1, wherein said arm member of said activatable latch, when in said second configuration, can engage said first structure comprising a surface of said UUT.

5. Apparatus, as claimed in claim 1, further comprising a lid at least partially covering said UUT, wherein said arm member of said activatable latch, when in said second configuration, can engage said first structure comprising a surface of said lid.

6. Apparatus, as claimed in claim 1 further comprising a vacuum connection system wherein the providing of a vacuum in a sealed region adjacent said first and second plurality of probes results in a force distributed substantially evenly across said support surface, tending to move said support surface toward said lower position.

7. Apparatus, as claimed in claim 1 further comprising an urging device which normally urges said support surface toward said upper position.

8. Apparatus, as claimed in claim 7, wherein said urging device includes at least a first spring.

9. Apparatus as claimed in claim 7 wherein said activatable latch prevents movement of said support member beyond said intermediate position under urging of said urging device.

10. Apparatus as claimed in claim 7 wherein said urging device substantially continuously urges said support surface toward said upper position at least whenever said support surface is in said lower position.

11. Apparatus, as claimed in claim 5, wherein said activatable latch includes at least a first arm which is extendable from a position which substantially clears a recess formed in said lid, to a position which engages a surface of said recess.

12. Apparatus, as claimed in claim 5, wherein said activatable latch includes at least a first arm which is rotatable from a position which substantially clears a recess formed in said lid, to a position which engages a surface of said recess.

13. Apparatus, as claimed in claim 6 wherein said sealed region is at least partially defined by a gasket, and wherein at least a portion of said activatable latch extends through said gasket.

14. Apparatus, as claimed in claim 6, wherein the substantial entirety of said activatable latch is positioned within said sealed region, at least while said support surface is in said lower position.

15. Apparatus which can position a unit under test (UUT) for contact with at least a first plurality of tall probes or at least a second plurality of short probes, comprising:

a support means for supporting said UUT, said support means being movable between at least an upper position wherein said UUT is spaced from said tall probes and said short probes, an intermediate position wherein said UUT contacts said tall probes and a lower position wherein said UUT contacts said tall probes and said short probes;

activatable latch means, movable between at least a first configuration, where said activatable latch means is disengaged from a first structure to allow said support means to move toward said lower position, and a second configuration where said activatable latch means is engaged with said first structure to prevent movement of said support means to a position from said lower position to said intermediate position.

16. Apparatus, as claimed in claim 15, wherein said UUT comprises a circuit board.

17. Apparatus, as claimed in claim 15, wherein said activatable latch means includes means for engaging a surface of said support means, at least when said latch means is in said second configuration.

18. Apparatus, as claimed in claim 15, wherein said activatable latch means includes means for engaging a surface of said UUT, at least when said latch means is in said second configuration.

19. Apparatus, as claimed in claim 15, further comprising lid means for substantially covering said UUT, wherein said activatable latch means includes means for engaging a surface of said lid when said latch means is in said second configuration.

20. Apparatus, as claimed in claim 15 further comprising a vacuum connection means for providing of a vacuum in a sealed region adjacent said first and second plurality of probes to provide a force tending to move said support means toward said lower position.

21. Apparatus, as claimed in claim 15 further comprising urging means for normally urging said support means toward said upper position.

22. Apparatus, as claimed in claim 21, wherein said urging means includes at least a first spring.

23. Apparatus as claimed in claim 21 wherein said activatable latch means includes means for preventing movement of said support means beyond said intermediate position under urging of said urging means.

24. Apparatus as claimed in claim 21 wherein said urging means is a means for substantially continuously urging said support means toward said upper position at least whenever said support means is in said lower position.

25. Apparatus, as claimed in claim 19, wherein said activatable latch means includes at least first arm means for extending from a position which substantially clears a recess formed in said lid, to a position which engages a surface of said recess.

26. Apparatus, as claimed in claim 19, wherein said activatable latch means includes means for rotating at least a first arm means from a position which substantially clears a recess formed in said lid, to a position which engages a surface of said recess.

27. Apparatus, as claimed in claim 20 further comprising at least a first gasket means at least partially defining said sealed region, and wherein at least a portion of said activatable latch means extends through said gasket means.

28. Apparatus, as claimed in claim 20, wherein the substantial entirety of said activatable latch means is positioned within said sealed region, at least while said support means is in said lower position.

29. A method for positioning a unit under test (UUT) for contact with at least a first plurality of tall probes or at least a second plurality of short probes, comprising:

providing a support member configured to support said UUT;

said support member being movable between at least an upper position wherein said UUT is spaced from said tall probes and said short probes, an intermediate position wherein said UUT contacts said tall probes and a lower position wherein said UUT contacts said tall probes and said short probes;

providing an activatable latch, movable between at least a first configuration, where said activatable latch is disengaged from a first structure to allow said support member to move toward said lower position, and a second configuration where said activatable latch is engaged with said first structure to restrict movement of said support member to a position from said lower position to said intermediate position;

moving said activatable latch to said first configuration;

providing at least a partial vacuum in a sealed region adjacent said probes, wherein said support member is moved towards said lower position;

performing a first series of tests on said UUT using at least some of said short probes;

moving said activatable latch to said second configuration;

at least partially releasing said partial vacuum, wherein said support member is moved toward said intermediate position and is restrained, by said activatable latch from moving beyond said intermediate position towards said upper position.

30. A method, as claimed in claim 29, wherein said UUT comprises a circuit board.

31. A method, as claimed in claim 29, further comprising engaging a surface of said support member with said activatable latch, when said activatable latch is in said second configuration.

32. A method, as claimed in claim 29, further comprising engaging a surface of said UUT with said activatable latch, when said activatable latch is in said second configuration.

33. A method, as claimed in claim 29, further comprising at least partially covering said UUT, with a lid, and engaging a surface of said lid with said activatable latch, when said activatable latch is in said second configuration.

34. A method, as claimed in claim 29 further comprising using an urging device to urge said support surface toward said upper position.

35. A method, as claimed in claim 34, wherein said urging device includes at least a first spring.

36. A method as claimed in claim 34 wherein said urging device substantially continuously urges said support surface toward said upper position at least whenever said support surface is in said lower position.

37. A method, as claimed in claim 32, wherein said activatable latch includes at least a first arm and further comprising extending said first arm from a position which substantially clears a recess formed in said lid, to a position which engages a surface of said recess.

38. A method, as claimed in claim 32, wherein said activatable latch includes at least a first arm and further comprising rotating said first arm from a position which substantially clears a recess formed in said lid, to a position which engages a surface of said recess.

39. A method, as claimed in claim 29 wherein said sealed region is at least partially defined by a gasket, and wherein at least a portion of said activatable latch extends through said gasket.

40. A method, as claimed in claim 29, wherein the substantial entirety of said activatable latch is positioned within said sealed region, at least while said support surface is in said lower position.

* * * * *